United States Patent [19]

Dalton et al.

[11] 3,717,790

[45] Feb. 20, 1973

[54] ION IMPLANTED SILICON DIODE ARRAY TARGETS FOR ELECTRON BEAM CAMERA TUBES

[75] Inventors: John Vincent Dalton, Oldwick; Alfred Urquhart MacRae, Berkeley, both of N.J.; James Robert Mathews, Reading, Pa.; Robert Alan Moline, Gillette; Kenneth Arnold Pickar, Westfield, both of N.J.; Harvey Donald Seidel, Pennside, Pa.

[73] Assignee: Bell Telephone Laboratories, Incorporated, Murray Hill, N.J.

[22] Filed: June 24, 1971

[21] Appl. No.: 156,440

[52] U.S. Cl. ............148/1.5, 317/235 R, 317/235 N, 317/235 NA

[51] Int. Cl. ..........................H01l 17/00, H01l 15/00

[58] Field of Search .............317/235 AY, 235 NA; 148/235 N, 148/235 CP

[56] References Cited

UNITED STATES PATENTS

| | | | |
|---|---|---|---|
| 3,390,019 | 2/1972 | Manchester | 148/1.5 |
| 3,585,439 | 6/1971 | Schneebeyer | 315/11 |
| 3,615,874 | 10/1971 | Lepselter | 148/1.5 |
| 3,445,926 | 5/1969 | Medved | 29/578 |

OTHER PUBLICATIONS

D. Davila, Applied Physics Letters, Vol. 14, No. 7, April 1969, pp. 227.

Fairchild, J., I.B.M. Technical Disclosure Bulletin, Vol. 13, No. 3, August 1970, page 806.

*Primary Examiner*—Martin H. Edlow
*Attorney*—R. J. Guenther et al.

[57] ABSTRACT

The specification describes processes using ion implantation for preparing silicon diode array targets for video camera tubes. Bulk silicon prepared in the conventional way has sufficient nonuniformity over the target area to produce contrast patterns in the video output. This effect can be eliminated by initially preparing high resistivity bulk material and implanting the bulk impurities to obtain the desired bulk resistivity. Advantageous procedures for implanting the diodes are also described.

9 Claims, 6 Drawing Figures

Figure 1A:
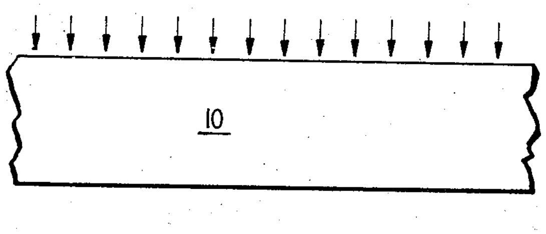

INVENTORS
J. V. DALTON
A. U. MAC RAE
J. R. MATHEWS
R. A. MOLINE
K. A. PICKAR
H. D. SEIDEL
BY [signature]
ATTORNEY

ION IMPLANTED SILICON DIODE ARRAY TARGETS FOR ELECTRON BEAM CAMERA TUBES

BACKGROUND OF THE INVENTION

This invention relates to electron beam imaging devices for use as video pickup tubes, and specifically to processing semiconductor diode array targets for electron beam camera tubes.

The silicon diode array target for video camera tubes, described and claimed in U.S. Pat. Nos. 3,403,284 and 3,419,746 has generated considerable interest in the art and appears to be destined for significant commercial success. The continuing development of this device, and of commercially attractive methods for its manufacture, has resulted in further contributions to the state of the art.

It has been found that diode array video targets characteristically suffer from a defect referred to by its discoverers as "coring". A video picture derived from such a target will exhibit a permanent contrast pattern that occurs typically in cyclonic pattern. The cause of "coring" has been attributed to resistivity striations produced in the semiconductor substrate during crystal growth. The coring effects have been found to be strongly voltage dependent, going through a maximum at normal levels, and the modulation amplitude of the coring has been observed as high as 40 percent. "-Modulation" in this connection means the ratio of the peak-to-peak modulation of the dark current introduced by the coring to the average dark current.

To understand how resistivity striations could produce a coring pattern and in particular its behavior as a function of target voltage, the voltage dependence of the dark current must be considered. The voltage dependence of the dark current of a diode array target is consistent with a model in which it is assumed that most of the dark current is generated by Shockley-Read centers located at the silicon-silicon dioxide interface. According to this theory there is a critical voltage $V_c$ above which the dark current rises steeply and then saturates. This behavior is interpreted as resulting from the formation of a depletion region under the oxide. That is, at the threshold voltage, $V_c$, the surface under the oxide is just beginning to deplete and as a result the electron-hole pairs generated by the interface states can now contribute to the dark current. Therefore, the dark current rapidly increases with increasing voltage and then saturates when the surface under the oxide is completely depleted at a voltage $V_d$. The threshold voltage $V_c$ will be a function of the oxide thickness and the net positive charge distribution in the system. More important, however, is the fact that the slope of the dark current vs. voltage curve for voltages slightly larger than $V_c$ will depend on the substrate resistivity.

If the resistivity of the silicon substrate at the interface is nonuniform along the interface due to the coring effect then for target voltages between $V_c$ and $V_d$ the depletion existing at the interface will vary in the same manner as the resistivity varies, and the dark current from a given area at the interface will be modulated with the modulation pattern reflecting the variation in resistivity. This modulation should be a strong function of target voltage because in this voltage range the dark current is a rapidly increasing function of target voltage; whereas at higher voltages the entire surface becomes strongly depleted and the modulation should approach zero. And indeed experimental results have shown close coincidence with this theory.

The possibility that the coring is produced by variations in the surface state density can be eliminated because the modulation of the coring pattern goes to zero at high target voltages where the entire surface under the oxide is strongly depleted. On the other hand, variations in the oxide fixed charge would produce coring consistent with the experimental results. However, the fact that no coring has been observed with targets fabricated from epitaxial substrates indicates that the oxide growth conditions do not produce such fixed charge variations in the absence of resistivity striations. The latter have been purposely introduced in a manner which further verifies the postulated origin of the coring effects.

According to one aspect of the invention, semiconductor diode array targets essentially free of coring effects have been produced by special preparation of the semiconductor substrate in a manner that maintains a high degree of control over the bulk substrate impurity distribution. The substrate is prepared initially with a very high resistivity (of the order of $10^{14}$ carriers per cm.$^3$ using the preferred N-type material, or a correspondingly low carrier concentration of the order of $10^{14}$ atoms cm.$^3$ if the substrate is P-type). The desired level of bulk substrate resistivity is then achieved with implantation using a significant ion impurity followed by thermal redistribution of the impurity into the substrate.

Ion implantation has also been used to advantage for forming the diode array in the implanted bulk material. Although the use of ion implantation for forming discrete diodes and for forming P-N junctions as source and drain elements in field-effect devices is well known, the specific details of the implantation technique as applied to the formation of a silicon diode array target are believed to be useful contributions to the art.

The formation of the diode array according to this aspect of the invention follows essentially the following steps. The bulk implanted material is oxidized to form an $SiO_2$ layer. Partial windows are etched into the oxide in the pattern desired for the array. These windows do not expose the silicon substrate but leave a protective coating through which the desired impurity is implanted. The array is then heat treated to diffuse the implanted impurities and thereby obtain "tuck-under" of the P-N junction. The insulator is then etched to expose the silicon in the aforementioned partial windows. Although these are the fundamental steps in the process, various details have been developed which form the basis for preferred embodiments.

These and other aspects of the invention will now be described in greater detail: In the drawing:

FIGS. 1A to 1F are schematic illustrations of various stages in the processing of a semiconductor target in accordance with one embodiment of the invention.

Referring first to FIG. 1A, a silicon substrate 10 is shown being bombarded (schematically) with an ion beam of a significant impurity to increase the conductivity. The original substrate is n-silicon with a resistivity of the order of 50 ohm cm or higher. The use of such high resistivity material is somewhat unusual by normal semiconductor processing standards, but it is not unique and techniques for preparing such material are well known. Ion implanting this bulk material to a resistivity level of approximately an order of magnitude less than the original value has been found to eliminate the coring patterns. This result is presumably due to the high degree of uniformity obtained through direct implantation of the background or bulk impurities. This technique for preparing the bulk silicon material is considered to be an important aspect of the invention. Obtaining bulk silicon free of coring from ingots grown with impurity concentrations in the usual range of $5 \times 10^{15}$ to $4 \times 10^{14}/cm^3$ (1–20 ohm cm) is difficult if at all possible.

Similar coring problems may occur in semiconductors other than silicon. However, to date diode array targets have been made almost exclusively from silicon and no such effects have been observed in other materials.

In the specific embodiment being described in connection with FIG. 1A, the substrate is bombarded with phosphorus with a total flux in the range of $10^{11}$ to $10^{12}$ ions/cm$^2$. It is necessary to anneal the implanted material at a temperature in excess of 600°C, but this occurs invariably during subsequent processing and need not require a separate step. In the preferred embodiment, the implant is made into the crystal before the oxide growth step described in connection with FIG. 1B. The typical oxide growth conditions, 22 hrs. in dry $0_2$ at 1,200°C, gives a diffusion length L ~ 5 microns for phosphorus, enough to diffuse the predeposited implanted impurity uniformly below the junction which is later formed by boron diffusion. Thus, both the bulk and surface depletion widths should be determined by the implanted phosphorus. For example, 100 ohm cm material implanted at 300 keV with $5 \times 10^{11}/cm^2$ P+ ions will give ~ $5 \times 10^{14}$ atoms per cc (~ 10 ohm cm) at the surface and $5 \times 10^{13}$ atoms/cc at a depth of 15 microns. Typical target thicknesses, e.g., 25 microns, are used.

Figure 1B:
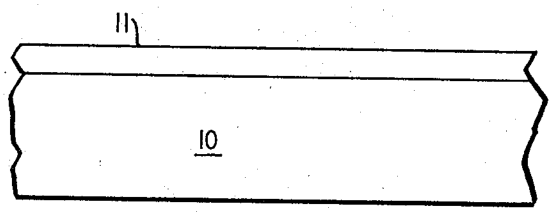

The implanted bulk material is then coated with an oxide layer 11 as shown in FIG. 1B. In this example, the layer is formed by dry oxidation according to well-known practice, and redistribution of the implanted impurity as described above is done simultaneously. Other methods for forming the layer and other insulating or masking materials can be used. Due to thermal diffusion of the impurities, appropriate ions doses will vary somewhat depending upon the method selected. The layer 11 is intended to function as a mask in subsequent ion implantation steps so that its thickness should be sufficient to avoid ion penetration. For $SiO_2$, a thickness of 1 micron is sufficient for ion energies normally used.

Alternatively, the insulating layer 11 can be formed prior to implanting the bulk impurities. In this event the layer is made somewhat thinner and the ion energy adjusted for the desired penetration. The ion energies used for subsequent implantation steps will be adjusted to appropriately lower values to avoid penetration.

Figure 1C:
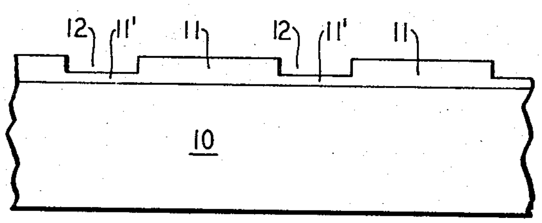

The oxide layer 11 is etched preferentially to form partial windows 12 as shown in FIG. 1C. As the diodes will be formed by implantation through these windows, they define the diode array. A thin layer of the oxide 11, designated 11' in the figure, is left intact at this point. Since the ultimate diode array target requires that the diode regions be free of insulating material, the retention of the layers 11' at this stage in the processing would ordinarily be viewed as unnecessary. However, this feature is important for at least two reasons. First, it protects the semiconductor surface from the introduction of contaminating impurities during this phase of the processing, and second, it "caps" the ions are implanted, in this case boron ions, within the silicon during implantation and subsequent annealing and diffusion. The later result is vital since the boron would otherwise evaporate from the silicon crystal. The straightforward way of forming the windows 11' is to etch through a homogenious layer 11 for a period of time predetermined to leave the appropriate thickness for layer 11'. In practice this can be done with adequate control. However, alternatives to this procedure are available that utilize well-known preferential etch properties of multilayer insulators such as $SiO_2$ and $Si_3N_4$. For example, layer 11 may comprise a composite layer comprising $SiO_2$ with a thickness corresponding to the thickness desired for layer 11' and the remaining thickness $Si_3N_4$. Using the well-known preferential etch for $Si_3N_4$, penetration will essentially terminate with layer 11 intact. Another alternative is to completely etch through layer 11 and subsequently regrow by standard methods a new layer of thickness 11'.

The thickness of the layer 11' can be varied widely depending upon the ion energies used in the implantation made through it. A convenient range is 200 to 5,000 A. The minimum of this range is simply that which can be controllably formed and will afford the desired protection. The maximum, of course, is limited by the ion energy one wishes to use, and the relative difference between the thickness of the respective layers 11 and 11'.

Figure 1D:
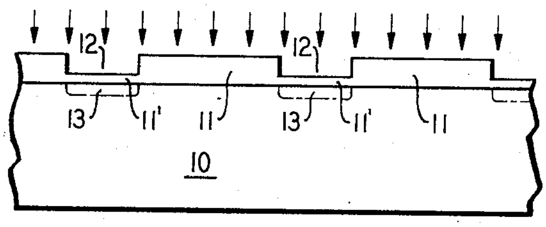
Figure 1E:
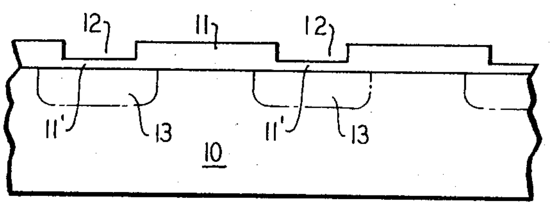

Implanting boron through the thin layer 11' as the first step in the formation of the diodes is indicated schematically in FIG. 1D. The implanted regions 13 are actually surface regions since, in this example, the bulk of the implanted impurities are within a few thousand angstroms of the silicon-silicon oxide interface. The impurities implanted are boron ions with a preferred dose of $3–5 \times 10^{15}$. Appropriate ion doses will generally lie in the range of $10^{14}$ to $10^{16}$ ions/cm$^2$. Lower doses tend to give somewhat higher dark currents in the video target. The maximum is prescribed according to practical considerations as there is no known advantage in exceeding the stated limit. An appropriate thickness for the layer 11' using the aforesaid ion flux can fall within the range 500 A to 2,000 A. Ion energies sufficient to penetrate layer 11' range from 60 keV to 80 keV. The penetration depth for 80 keV boron ions through $SiO_2$ averages approximately 2,500 A.

It will be noted that the site of the implanted ions within the silicon substrate 10 follows precisely the boundaries of the window 12. Thus, removal of the layer 11' at this stage will expose the edges of the P-N junctions forming the diodes. In order to achieve "tuck under" of the diodes below the masking (and then passivating) layer 11, activation of the implanted impurities, and annealing of Si–$SiO_2$ interface states, the substrate is heated to a temperature and for a time period sufficient to diffuse the junction laterally so that it lies essentially underneath the insulating layer at the edge of the window, FIG. 1E. Ordinarily, it is recommended that the tuck-in diffusion extend laterally to one-half micron or more. In this specific embodiment, a thermal treatment at 1,130°C for approximately one hour will give this result; in fact, this particular treatment will extend the junction a distance of the order of 2 microns laterally under the oxide. Typically, diffusion temperatures for boron in silicon are in excess of 1,000°C.

A preferred form of the silicon diode array target requires a low resistivity region on the side of the target exposed to the optical image. The function of this layer is to reduce hole recombination and to give a higher hole capture ratio for a given level of incident light. This expedient is described in detail in U.S. Pat. No. 3,458,782 granted July 29, 1969, to T. M. Buck and J. V. Dalton, and assigned to this assignee. Typically, according to those teachings, a layer of phosphorus is diffused a few tenths of microns into the surface of the target exposed to the light image. This is noteworthy in connection with this invention in that the diode array is appropriately protected during the phosphorus diffusion by the oxide coating already in place. This is in contrast with the normal thermal diffusion, or ion implantation of boron into bare silicon, during which it is necessary to take added precaution to protect the exposed substrate during the phosphorus diffusion.

Figure 1F:
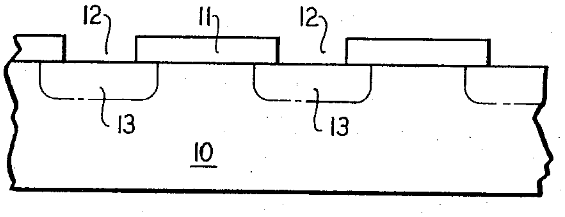

Finally, in order to expose the diodes to the electron beam of the completed camera tube, it is necessary to etch the partially coated windows to expose the diodes as shown in FIG. 1F. This can be accomplished by treating the array with HF for a period calculated to remove the thin oxide coating. The thick oxide layer, although now somewhat thinner, remains to isolate the remainder of the target from the electron beam.

The target is then preferably coated with a resistive sea according to known silicon diode array technology. This and other potential target modifications are discussed in the *Bell System Technical Journal*, Vol. 48, No. 5, May-June, 1969. Other processing details, assembly of the target within the tube, and the basic structure of the tube are conventional and are given in detail in the references noted previously or elsewhere.

Various additional modifications and deviations of this process will occur to those skilled in the art. All variations, alternatives and equivalents that rely on the basic teachings through which this invention has advanced the art are properly considered to be within the scope of this invention.

What is claimed is:

1. A method for the production of silicon diode array targets for video cameras comprising the steps of:

implanting by ion bombardment a silicon substrate having an initial electrical resistivity in excess of approximately 50 ohm cm with a first conductivity type impurity to produce a uniform resistivity layer having a resistance value of at least an order of magnitude less than the initial substrate resistivity, forming an insulating layer over the substrate with openings in the layer corresponding to the desired array, and implanting impurity regions in the said openings of the insulating layer of a second conductivity type which, with the substrate, form P-N junctions.

2. The method of claim 1 in which the substrate is N-type silicon and the impurity regions are P-type.

3. The method of claim 1 in which the insulating layer is silicon dioxide.

4. The method of claim 1 in which the initial resistivity of the substrate is approximately 100 ohm cm and the resistivity of the implanted material is of the order of 10 ohm cm.

5. The method of claim 1 in which the substrate is heated after it is implanted to a temperature in excess of 600°C.

6. A method for the production of silicon diode array targets for video cameras comprising the steps of:

implanting by ion bombardment a silicon substrate having an electrical resistivity in excess of approximately 50 ohm cm with an impurity of a first conductivity type to produce a uniform resistivity layer having a resistivity value of an order of magnitude less than the initial substrate resistivity, forming an insulating layer on the surface of said substrate, said insulating layer having a first region with a predominant thickness sufficient to prevent penetration by ions from an ion beam and an array of regions of reduced thickness allowing penetration by ions from an ion beam said array corresponding to the diode array, implanting by ion bombardment through said regions of reduced thickness an impurity of a second conductivity type to form an array of impurity regions that form with the substrate an array of P-N junctions, heating the substrate to cause the said P-N junctions to diffuse laterally to a distance of the order of one-half micron or more, and removing the insulating regions of reduced thickness to expose the array of diodes.

7. The method of claim 6 in which the substrate is n-type and the implanted ions are boron.

8. The method of claim 7 in which the substrate is heated to a temperature in excess of 1,000°C.

9. The method of claim 7 in which the ion dose is in the range of $10^{14}$ to $10^{16}$ ions/cm$^2$.

* * * * *